United States Patent
Ryu et al.

(10) Patent No.: US 6,562,707 B2
(45) Date of Patent: May 13, 2003

(54) METHOD OF FORMING A SEMICONDUCTOR DEVICE USING SELECTIVE EPITAXIAL GROWTH

(75) Inventors: Jong-Ryol Ryu, Kyunggi-do (KR); Jung-Woo Park, Seoul (KR); Jung-Min Ha, Seoul (KR); Si-Young Choi, Kyunggi-do (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/043,942

(22) Filed: Jan. 10, 2002

(65) Prior Publication Data

US 2002/0146888 A1 Oct. 10, 2002

(30) Foreign Application Priority Data

Apr. 7, 2001 (KR) .......................................... 2001-18506

(51) Int. Cl.[7] ................. H01L 21/3205; H01L 21/4763; H01L 21/336; H01L 21/302; H01L 21/461

(52) U.S. Cl. ........................ 438/585; 438/723; 438/268

(58) Field of Search ................................. 438/585, 723, 438/268, 276, 192, 269

(56) References Cited

U.S. PATENT DOCUMENTS

| 6,020,239 A | 2/2000 | Gambino et al. ...... 257/29.262 |
| 6,127,230 A | 10/2000 | Tang et al. ............ 257/29.052 |
| 6,165,279 A | 12/2000 | Tsao et al. ...................... 134/2 |
| 6,204,532 B1 | 3/2001 | Gambino et al. ........... 257/329 |
| 6,372,657 B1 | 4/2002 | Hineman et al. ............ 134/1.2 |
| 2001/0014504 A1 | 8/2001 | Moon ......................... 438/269 |

OTHER PUBLICATIONS

Wolf et al, Silicon Processing For The VLSI Era 1986, Lattice Press, vol. 1, p. 520.

*Primary Examiner*—John F. Niebling
*Assistant Examiner*—Walter L. Lindsay, Jr.
(74) *Attorney, Agent, or Firm*—Marger Johnson & McCollom, P.C.

(57) ABSTRACT

A method of forming a semiconductor device using selective epitaxial growth (SEG) is provided. This method includes forming an insulating layer pattern having a window on a semiconductor substrate. The window exposes a predetermined region of the semiconductor substrate. The substrate having the window is cleaned, thereby removing any native oxide layer on the exposed substrate. The cleaned substrate is oxidized. Accordingly, a sacrificial oxide layer is formed thereon. The sacrificial oxide layer is removed. Thus, the exposed substrate has substantially no crystalline defects. A single crystalline semiconductor layer is then grown on the exposed substrate using SEG.

12 Claims, 8 Drawing Sheets

METHOD OF FORMING A SEMICONDUCTOR DEVICE USING SELECTIVE EPITAXIAL GROWTH

This application relies for priority upon Korean Patent Application No. 2001-18506, filed on Apr. 7, 2001, the contents of which are herein incorporated by reference in their entirety.

BACKGROUND OF THE INVENTION

1. Field of the Invention

The present invention relates to a method of forming a semiconductor device using selective epitaxial growth (SEG).

2. Description of the Related Art

The Selective Epitaxial Growth (SEG) method enables a single crystalline silicon layer to be grown only on a selected area of the substrate. Therefore, regions where the epitaxial growth will occur must first be defined before actually performing the epitaxial growth.

The epitaxial growth region is defined by selectively exposing a portion of the substrate. For example, an insulating layer such as a silicon oxide is removed through a photolithography and etching process, exposing a silicon substrate. The exposed silicon substrate enables epitaxial growth and is called a seed window.

The SEG method may be used for trench isolation techniques or contact techniques as well. In the trench isolation method using SEG, the oxide layer is first formed on the silicon substrate. In the conventional method, a trench is formed in the silicon substrate through an etching process and filled with oxide layer. The oxide layer is then patterned using an anisotropic etching technique, forming a trench that exposes the substrate. An epitaxial layer is selectively grown on the exposed substrate. As a result, the trench is filled with the selective epitaxial layer. Here, the epitaxial layer acts as an active region and the patterned oxide layer acts as an isolation region. A discrete device such as a MOS transistor is formed at the active region.

One drawback due to the high integration density of semiconductor devices is that the width of the contact hole is reduced. The contact hole should be filled with a conductive layer such as a metal layer or a polysilicon layer. A chemical vapor deposition (CVD) process is widely used to form the conductive layer. In this case, it is difficult to fill the contact hole due to a high aspect ratio. However, even though the contact hole has a high aspect ratio, the contact hole can be completely filled with the epitaxial layer. The epitaxial layer in the contact hole is referred to a contact plug. The selective epitaxial growth in the contact hole is performed after a gate electrode and source/drain regions are formed on the substrate.

Furthermore, if over etching occurs when forming contact holes in source/drain regions with a shallow junction depth, the substrate under the source/drain regions may be exposed or the depth of the source/drain regions reduced. In addition, if the contact plug is formed of a metal such as tungsten or aluminum, a junction spiking phenomenon might occur due to the shallow junction depth. However, if the contact plug is formed after the source/drain regions are elevated by a silicon epitaxial layer, it is possible to prevent junction spiking as well as void formation.

In the mean time, the anisotropic etching step, such as Reactive Ion Etching (RIE), or ion implantation, are usually performed prior to the selective epitaxial growth. Therefore, physical damage caused by etching or ion implantation generates defects directly on the surface of the substrate. The epitaxial growth is largely affected by the surface state of the substrate. That is to say, growing a single crystal layer can be difficult, if the selective epitaxial growth occurs on a defective substrate. On a defective substrate, the selective epitaxial growth rate is greatly reduced or an epitaxial layer with a single crystalline structure may never form.

Moreover, the active region formed on a defective substrate through the selective epitaxial growth process may have crystalline defects. Therefore, any MOS transistor formed on an active region with crystalline defects may exhibit undesirable device characteristics.

SUMMARY OF THE INVENTION

It is therefore an object of the present invention to provide a method of forming a semiconductor device using selective epitaxial growth, which can produce a high-integrity single crystalline semiconductor layer.

It is another object of this invention to provide a method of forming a semiconductor device using selective epitaxial growth, which is capable of increasing process margin and epitaxial growth rate.

These and other objects, advantages, and features of the present invention are provided by a method of forming a semiconductor device using selective epitaxial growth. This method improves the quality of the epitaxial layer. According to one aspect of the present invention, the method includes forming a window for selective epitaxial growth on a semiconductor substrate. The window exposes a region of the substrate. The exposed surface of the substrate is cleaned with a hydrofluoric acid solution, thereby removing a first oxide layer (e.g. a native oxide layer) that exists on the exposed substrate. The exposed substrate is oxidized, thereby forming a second oxide layer (e.g. a sacrificial oxide layer) on the cleaned surface exposed by the window. The second oxide layer is removed to expose a region of the substrate within the window. A selective epitaxial growth process is then performed on the exposed region of the substrate.

The first and second oxide layers may be removed using diluted hydrofluoric acid, which is called a buffered oxide etchant (BOE). Also, the second oxide layer may be formed using a standard cleaning 1 (SC1) solution. The SC1 solution is a mixture of ammonium hydroxide, hydrogen peroxide and de-ionized water at a predetermined volume ratio.

BRIEF DESCRIPTION OF THE DRAWINGS

These and other features, aspects, and advantages of the present invention will become better understood with regard to the following description, appended claims, and accompanying drawings where:

DETAILED DESCRIPTION OF THE PREFERRED EMBODIMENTS

The present invention will now be described more fully with reference to the accompanying drawings, in which preferred embodiments of the invention are shown.

(First Embodiment)

FIGS. 1 through 5 are cross-sectional views for explaining a method of forming a semiconductor device in accordance with one embodiment of the present invention.

Figure 1:
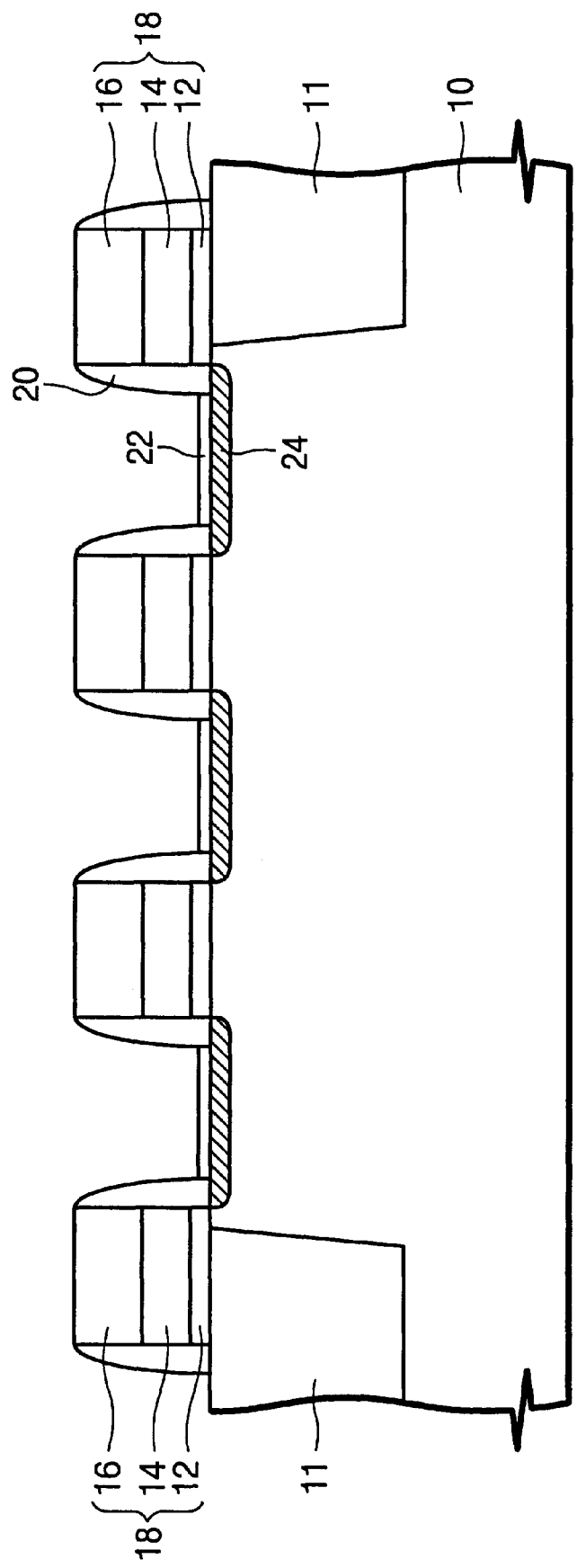
FIGS. 1 through 5 are cross sectional views illustrating a preferred method of forming a semiconductor device according to one embodiment of the present invention.

Referring to FIG. 1, a gate insulating layer 12, a gate conductive layer 14 and a capping insulating layer 16 are sequentially formed on a single crystalline silicon substrate 10 where a device isolation layer 11 is formed. The capping insulating layer 16, the gate conductive layer 14, and the gate insulating layer 12 are successively patterned to form agate pattern 18. Using the gate pattern 18 as an ion implantation mask:, impurity ions are implanted into the substrate 10 at a low dose, for example, of $1\times10^{12}$ to $1\times10^{14}$ ion atoms/cm$^2$, thereby forming an LDD (lightly doped drain) region (not shown). An insulating layer such as a silicon nitride layer or a silicon oxide layer is formed on the entire surface of the substrate having the LDD region. The insulating layer is anisotropically etched to form a spacer 20 on the sidewall of the gate pattern 18. At this time, the LDD region is exposed and etching and ion implantation damage can occur at the surface of the exposed LDD region. Also, a native oxide layer 22 may exist on the LDD region. As a result, a crystalline defect layer 24 is formed at the surface of the LDD region. The exposed LDD region serves as a seed window for selective epitaxial growth.

Figure 2:
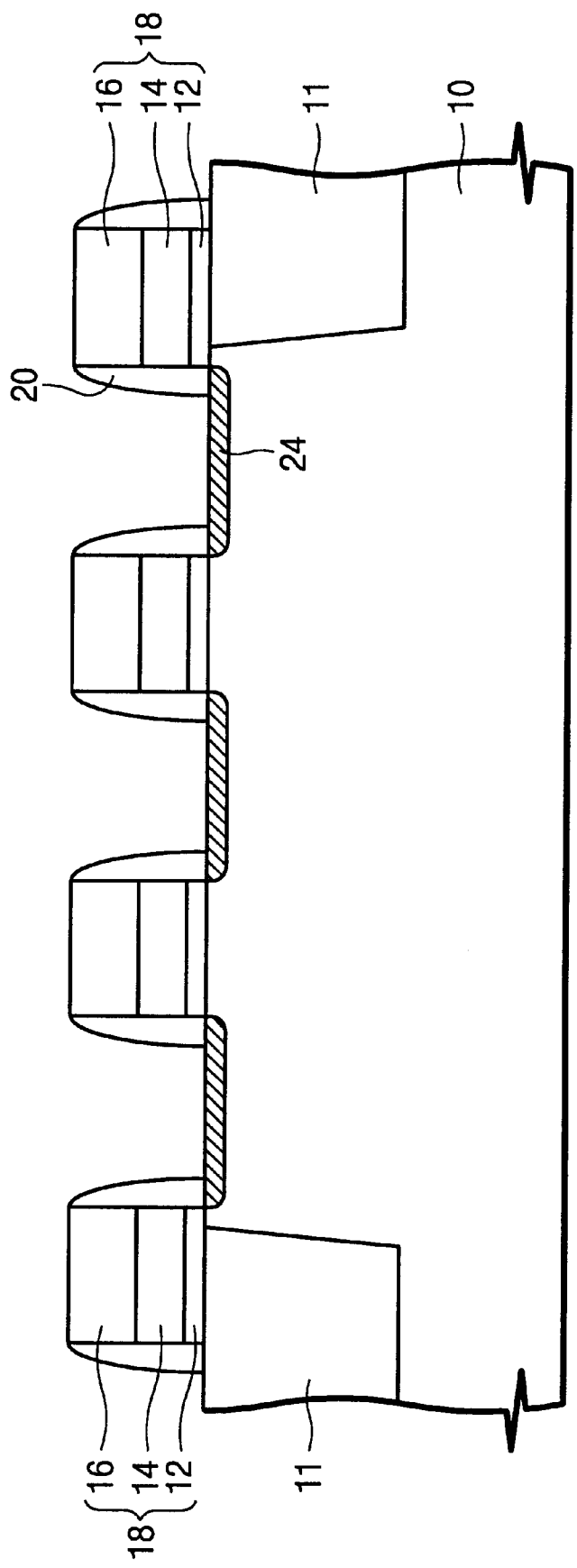

Referring to FIG. 2, the substrate with spacer 20 is dipped into diluted hydrofluoric acid (a buffered oxide etchant; BOE) in order to remove the native oxide layer 22. Accordingly, the crystalline defect layer 24 is substantially completely exposed.

Figure 3:
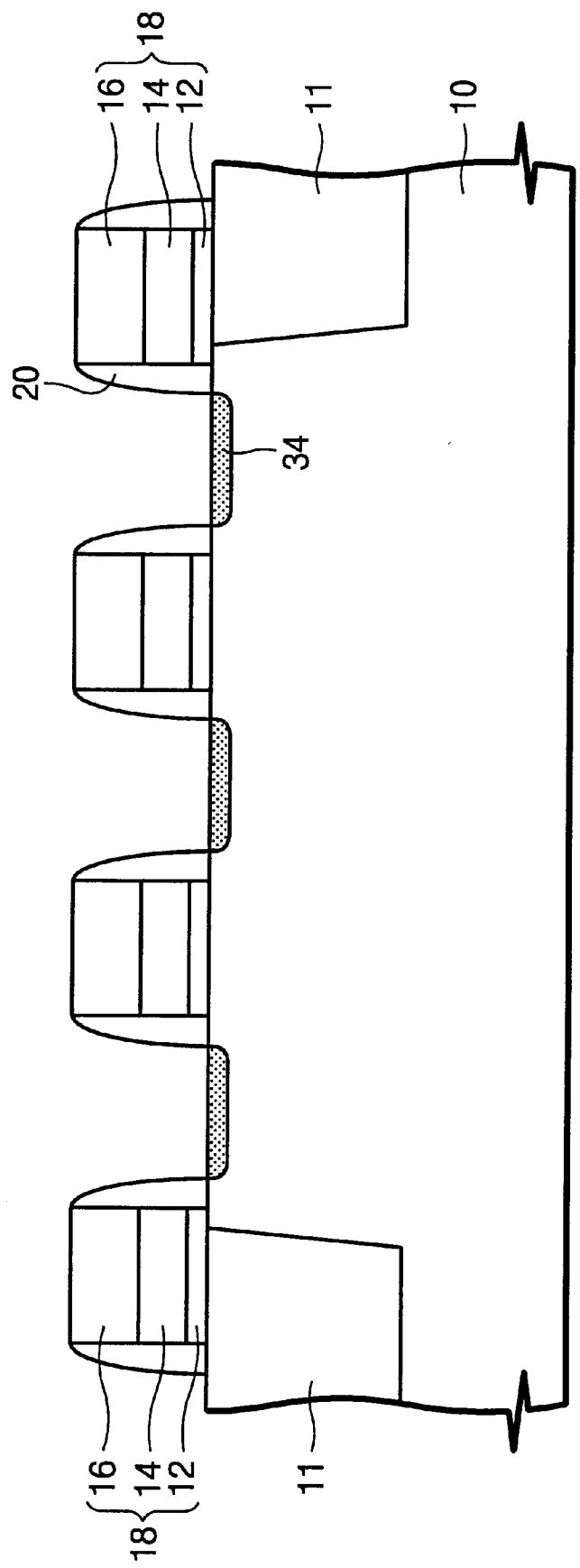

Referring to FIG. 3, the substrate with exposed crystalline defect layer 24 is dipped into an oxidation solution such as a standard cleaning 1 (SC1) solution. It is preferable that the dipping time be from 5 minutes to 30 minutes long and the temperature of the SC1 solution is 40 to 80 degrees C. The dipping time may depend on the thickness of the crystalline defect layer 24. The SC1 solution is a mixture of ammonium hydroxide (NH$_4$OH), hydrogen peroxide (H$_2$O$_2$) and de-ionized water (H$_2$O). The volume ratio of ammonium hydroxide (NH$_4$OH), hydrogen peroxide (H$_2$O$_2$) and de-ionized water (H$_2$O) is 1:4:20. The SC1 solution is widely used for removing contaminants such as particles on a substrate. Also, the SC1 solution oxidizes the substrate 10. Thus, the crystalline defect layer 24 is oxidized by the SC1 solution. As a result, the SC1 solution convert most of the crystalline defect layer 24 (not shown in FIG. 3 and herein after) into a silicon oxide layer 34, e.g. a sacrificial oxide layer.

Figure 4:
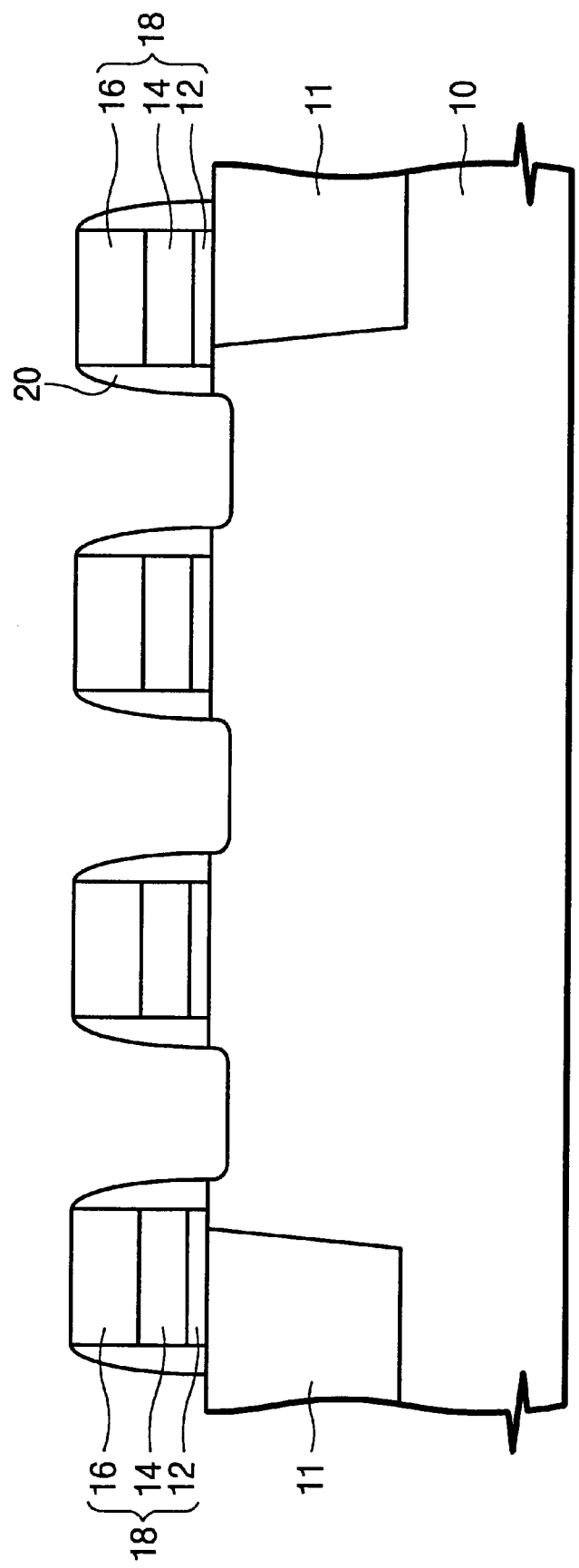

Referring to FIG. 4, the substrate having the silicon oxide layer 34 is again dipped into the BOE solution in order to remove the silicon oxide layer 34. Thus, the LDD region is exposed. However, no physical damage harms the LDD region, since the oxide layer 34 is removed by a wet etchant such as a BOE solution (diluted hydrofluoric acid). As a result, the surface of the exposed LDD region has substantially no crystalline defects.

Figure 5:
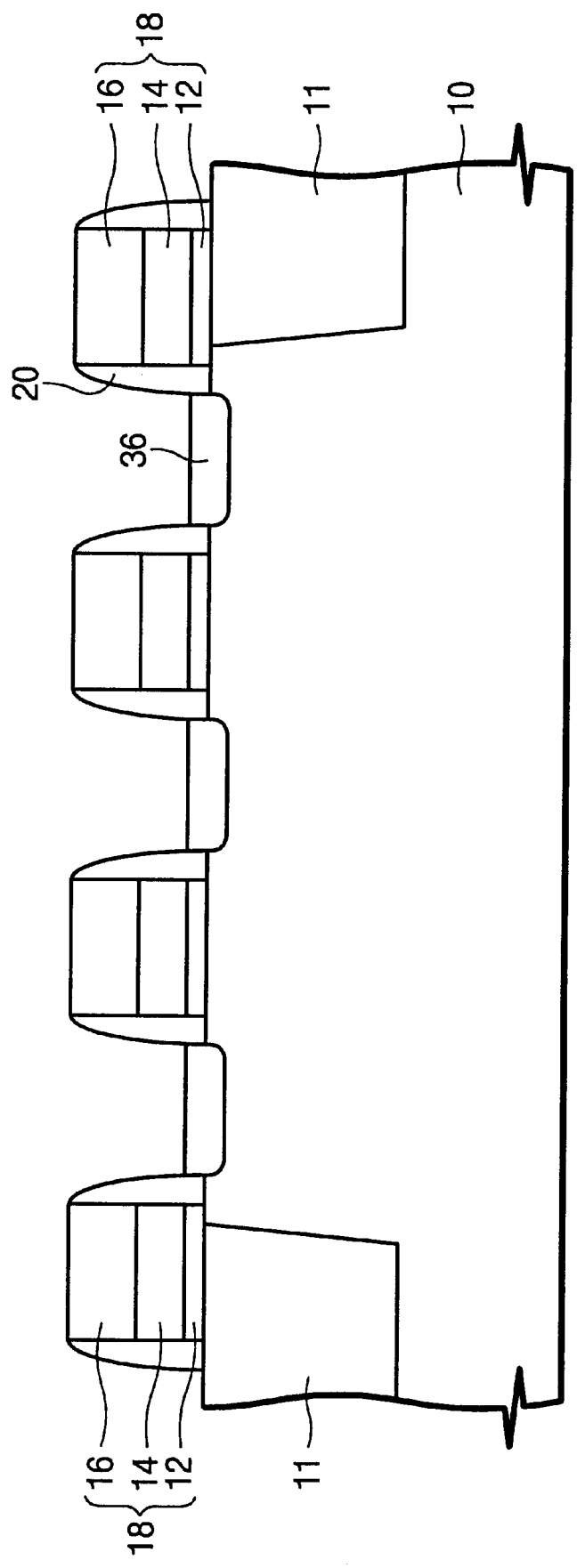

Referring to FIG. 5, a selective epitaxial growth process is performed after removing the silicon oxide layer 34, thereby forming a single crystalline silicon layer 36 on the exposed LDD region. The selective epitaxial growth technique is well known to those skilled in the art. For example, the selective epitaxial growth process may be performed using silane (SiH$_4$) gas or disilane (Si$_2$H$_6$) gas as a silicon source gas in a low pressure of 1 Torr or less. Also, a chlorine gas may be additionally used before the selective epitaxial growth process. The chlorine gas etches a silicon layer. Thus, even though a thin oxide layer exists on the LDD region, the thin oxide layer can be easily removed along with the surface layer of the LDD region prior to formation of the epitaxial layer. The single crystalline silicon layer 36 is then doped with impurities. In addition, a metal silicide layer (not shown) may be formed on the doped single crystalline silicon layer 36. The metal silicide layer improves contact resistance between the LDD region and an interconnection to be formed on the metal silicide layer. Even though the metal silicide layer is formed over the LDD region, the junction leakage current characteristic is not degraded because of the presence of the single crystalline silicon layer 36.

(Second Embodiment)

FIGS. 6 through 11 are cross-sectional views for illustrating a trench isolation method in accordance with another embodiment of the present invention.

Figure 6:
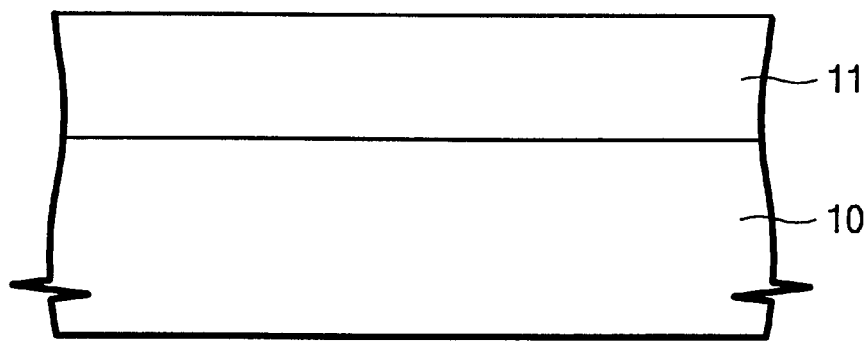
FIGS. 6 through 11 are cross sectional views illustrating a preferred method of forming a semiconductor device according to another embodiment of the present invention.

Referring to FIG. 6, an insulating layer 11 formed on a surface of a single crystalline silicon substrate 10. The insulating layer 11 maybe composed of an oxide layer such as a thermal oxide layer.

Figure 7:
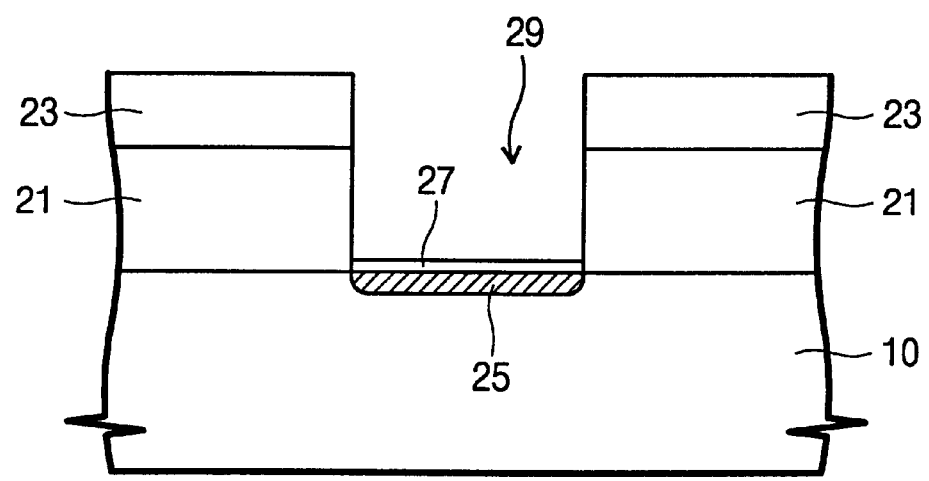

Referring to FIG. 7, a photoresist layer is coated on the insulating layer 11 by conventional techniques such as spin coating. The photoresist layer is patterned using a photolithography and etching process, thereby forming a photoresist pattern 23, i.e. an etching mask pattern. A predetermined region of the insulating layer 11 is exposed or uncovered by the photoresist pattern 23. The insulating layer 11 is anisotropically etched using the photoresist pattern 23 as an etching mask, thereby forming an insulating layer pattern 21. The insulating layer pattern 21 defines a trench 29 exposing a predetermined region of the substrate 10. Etching damage occurs at the surface of the exposed substrate while anisotropically etching the insulating layer 11. Thus, a crystalline defects layer 25 is formed at the surface of the exposed substrate due to the etching damage. Also, a native oxide layer 27 can form on the crystalline defects layer 25.

Figure 8:
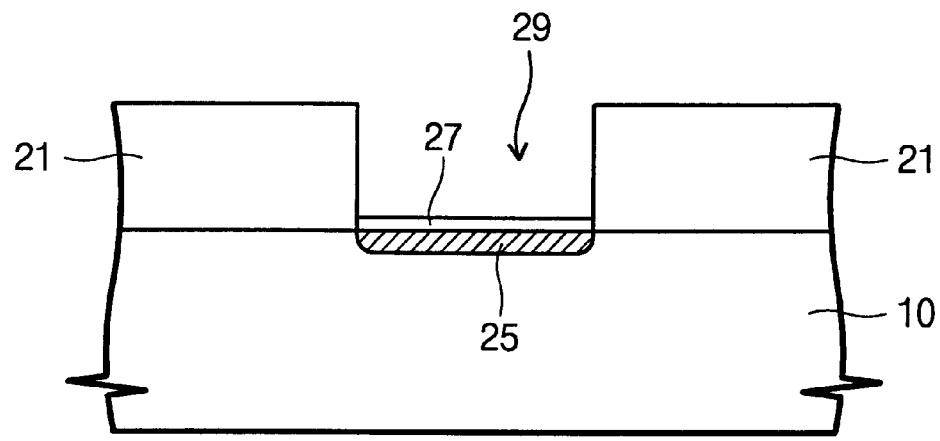

Referring to FIG. 8, the photoresist pattern 23 is removed. At this time, the surface of the exposed substrate maybe further damaged. In addition, the thickness of the native oxide layer 27 may increase.

Figure 9:
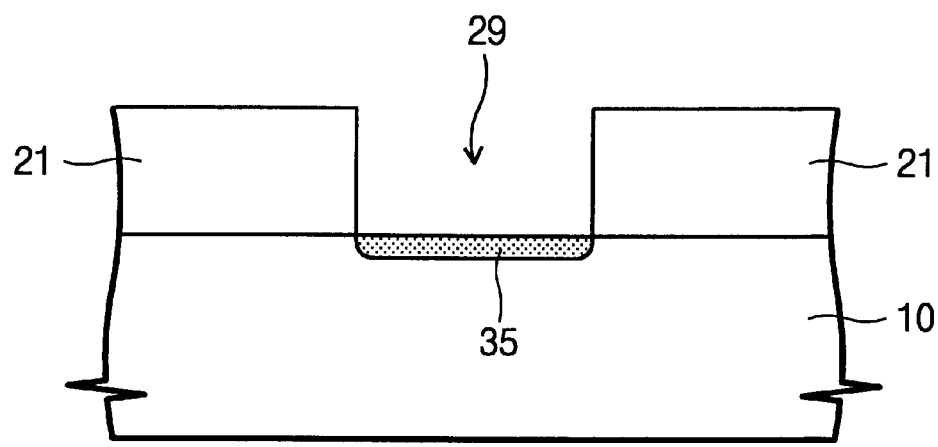
Figure 10:
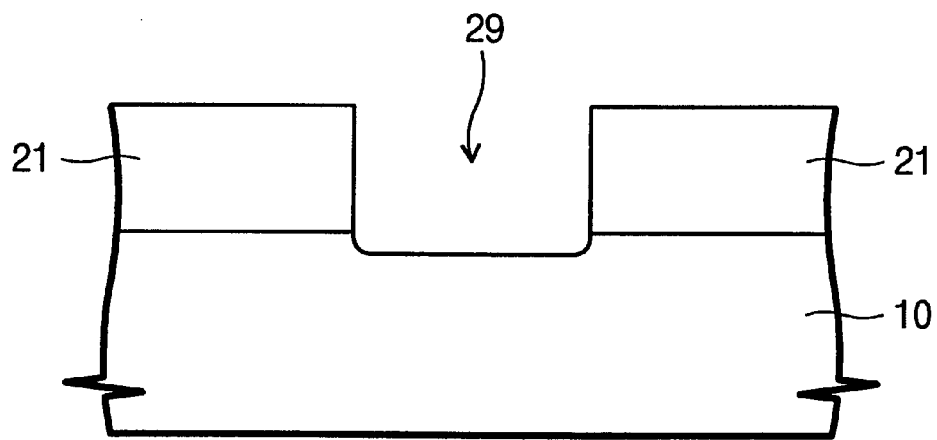
Figure 11:
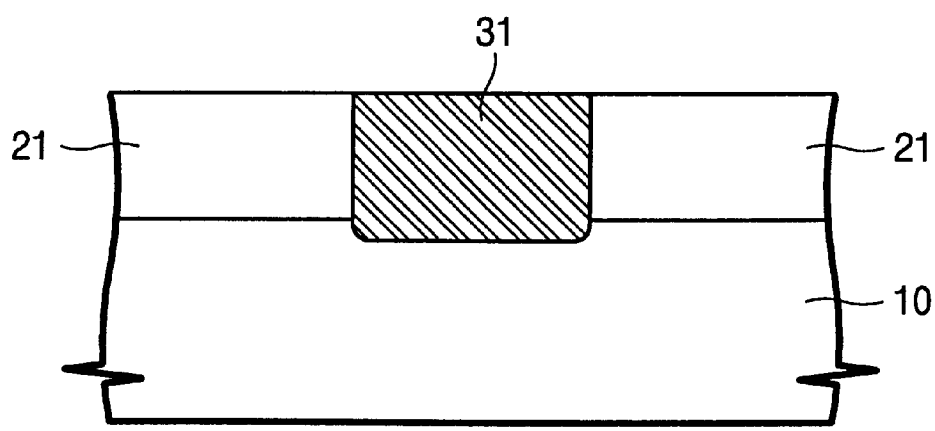

Referring to FIGS. 9 through 11, the native oxide layer 27 is removed and most of the crystalline defects layer 25 is changed into oxidized layer 35, which is removed in the same manner as in the first embodiment of the present invention described above with reference to FIGS. 1–6. Also, a single crystalline silicon layer 31 filling the trench 29 is formed in the same manner as the first embodiment of the present invention described above with reference to FIGS. 1–6.

According to this invention, the crystalline defects and the native oxide layer are substantially completely removed prior to formation of the single crystalline silicon layer. Accordingly, it is possible to grow the epitaxial single crystalline silicon layer uniformly and without crystal defects.

Having described and illustrated the principles of the invention in a preferred embodiment thereof, it should be apparent that the invention can be modified in arrangement and detail without departing from such principles. We claim all modifications and variations coming within the spirit and scope of the following claims.

What is claimed is:

1. A method for forming a semiconductor device, comprising:

forming an insulating layer disposed on a semiconductor substrate;

forming a window in the insulating layer to expose a predetermined region of the semiconductor substrate;

removing any native oxide layer that exists on the exposed region of the substrate;

oxidizing the exposed region of the substrate to form a sacrificial oxide layer;

removing the sacrificial oxide layer; and growing a single crystalline semiconductor layer on the substrate by selective epitaxial growth where the sacrificial oxide layer was removed.

2. The method according to claim 1, wherein said removing any native oxide layer comprises using an oxide etchant.

3. The method according to claim 1, wherein said oxidizing comprises using an oxidation solution, and wherein the oxidation solution is a mixture of the ammonium hydroxide ($NH_4OH$), hydrogen peroxide ($H_2O_2$) and de-ionized water ($H_2O$).

4. The method according to claim 3, wherein the temperature of the mixture is approximately 40 to 80 degrees C, and the oxidation step is performed for approximately 5 to 30 minutes.

5. The method according to claim 1, wherein said removing the sacrificial oxide layer comprises using an oxide etchant.

6. The method according to claim 5, wherein the oxide etchant is a buffered oxide etchant (BOE).

7. A method of forming a semiconductor device, comprising:

forming a gate stack on a semiconductor substrate;

implanting impurity ions into the substrate using the gate pattern as an implantation mask to form LDD regions on sides of the gate pattern;

forming an insulating layer on the gate pattern;

anisotropically etching the insulating layer to form a spacer on sidewalls of the gate pattern;

cleaning the surfaces of the LDD regions using an oxide etchant to remove any native oxide layer that exists on the LDD regions;

oxidizing the cleaned surfaces of the LDD regions using an oxidation solution to form a sacrificial oxide layer;

removing the sacrificial oxide layer using an oxide etchant to expose the LDD regions; and growing a single crystalline semiconductor layer on the exposed LDD regions.

8. The method according to claim 7, further comprising a step of forming a metal silicide layer on the single crystalline semiconductor layer.

9. A method of forming a semiconductor device, comprising:

forming an insulating layer on a silicon substrate;

forming a trench in the insulating layer to expose a region of the substrate;

cleaning the surface of the exposed substrate using an oxide etchant, thereby removing any native oxide layer that exists on the exposed region of the substrate;

oxidizing the cleaned surface of the substrate, thereby forming a sacrificial oxide layer thereon;

removing the sacrificial oxide layer using an oxide etchant to expose the substrate thereunder, and growing a single crystalline semiconductor layer on the exposed substrate by selective epitaxial growth to form an active region filling the trench.

10. The method according to claim 9, wherein the step of growing the single crystalline semiconductor layer is performed using a chlorine gas.

11. A method of forming a semiconductor device, comprising:

forming gate stacks on a semiconductor substrate;

forming impurity regions on sides of the gate stacks in the semiconductor substrate;

removing any native oxide layer that exists on the impurity regions;

oxidizing the impurity regions to form a sacrificial oxide layer;

removing the sacrificial oxide layer to expose the impurity regions; and growing a single crystalline semiconductor layer on the exposed impurity regions.

12. The method according to claim 11, wherein the single crystalline semiconductor layer comprises silicon.

* * * * *